(12) United States Patent
Kim et al.

(10) Patent No.: US 8,916,914 B2
(45) Date of Patent: Dec. 23, 2014

(54) FIELD EFFECT TRANSISTOR HAVING DOUBLE TRANSITION METAL DICHALCOGENIDE CHANNELS

(71) Applicant: Samsung Electronics Co., Ltd., Suwon-Si (KR)

(72) Inventors: Eok-su Kim, Seongnam-si (KR); Sun-hee Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/942,831

(22) Filed: Jul. 16, 2013

(65) Prior Publication Data
US 2014/0183453 A1 Jul. 3, 2014

(30) Foreign Application Priority Data
Dec. 27, 2012 (KR) .................. 10-2012-0155322

(51) Int. Cl.
*H01L 21/48* (2006.01)
*H01L 29/15* (2006.01)

(52) U.S. Cl.
CPC ................... *H01L 29/151* (2013.01)
USPC ......................... 257/288; 257/368

(58) Field of Classification Search
CPC . H01L 29/151; H01L 29/0673; H01L 29/267; H01L 29/775; H01L 29/41725; H01L 29/78681; H01L 33/0041; H01L 21/02568; H01L 27/283

USPC .............................. 257/13, 40, 194, 288, 368
See application file for complete search history.

(56) References Cited

U.S. PATENT DOCUMENTS

| 7,242,041 | B2 | 7/2007 | Bucher et al. | |
|---|---|---|---|---|
| 7,307,277 | B2 | 12/2007 | Frey et al. | |
| 7,670,887 | B2 | 3/2010 | Bucher et al. | |
| 2005/0023522 | A1* | 2/2005 | Frey et al. | 257/40 |
| 2005/0062082 | A1* | 3/2005 | Bucher et al. | 257/288 |
| 2013/0143336 | A1* | 6/2013 | Jain | 438/22 |
| 2014/0197459 | A1* | 7/2014 | Kis et al. | 257/194 |

FOREIGN PATENT DOCUMENTS

| KR | 20090106320 A | 10/2009 |
|---|---|---|
| KR | 20110034536 A | 4/2011 |
| WO | WO-2012060096 A1 | 5/2012 |

\* cited by examiner

*Primary Examiner* — Michael Lebentritt
(74) *Attorney, Agent, or Firm* — Harness, Dickey & Pierce, P.L.C.

(57) ABSTRACT

A field effect transistor (FET) includes first and second channels stacked on a substrate, the first and second channels formed of a transition metal dichalcogenide, a source electrode and a drain electrode contacting both the first channel and the second channel, each of the source electrode and the drain electrode having one end between the first channel and the second channel, and a first gate electrode corresponding to at least one of the first channel and the second channel.

15 Claims, 2 Drawing Sheets

FIELD EFFECT TRANSISTOR HAVING DOUBLE TRANSITION METAL DICHALCOGENIDE CHANNELS

CROSS-REFERENCE TO RELATED APPLICATION

This application claims the benefit of Korean Patent Application No. 10-2012-0155322, filed on Dec. 27, 2012, in the Korean Intellectual Property Office, the disclosure of which is incorporated herein in its entirety by reference.

BACKGROUND

1. Field

Example embodiments relate to a field effect transistor (FET) having double transition metal dichalcogenide channels that contact both surfaces of a source electrode and a drain electrode and a semiconductor device including the same.

2. Description of the Related Art

Characteristics of a field effect transistor (FET) may vary according to a material of a channel layer. A material of a channel layer is an important factor that determines characteristics of a FET. For example, carrier mobility and an on/off ratio of a FET depend on the characteristics of the FET. Instead of a silicon channel, graphene is receiving attention for use as a two-dimensional semiconductor channel. The carrier mobility of graphene is relatively high but the on/off ratio characteristic is undesirable. Accordingly, research has been conducted to improve the on/off characteristics of graphene.

However, if a transition metal dichalcogenide, which is a two-dimensional semiconductor, is used as a channel, the on/off ratio characteristic is desirable but the carrier mobility is relatively low.

SUMMARY

Example embodiments provide field effect transistors (FETs) having double transition metal dichalcogenide channels with improved carrier mobility.

Additional aspects will be set forth in part in the description which follows and, in part, will be apparent from the description, or may be learned by practice of example embodiments.

According to example embodiments, an FET having double transition metal dichalcogenide channels may include first and second channels stacked on a substrate, the first and second channels including a transition metal dichalcogenide, a source electrode and a drain electrode contacting both the first channel and the second channel, each of the source electrode and the drain electrode having one end between the first channel and the second channel, and a first gate electrode corresponding to at least one of the first channel and the second channel.

Each of the first channel and the second channel may have one of a single layer and multi-layer structure. The first and second channels may include a compound including a transition metal and two chalcogens that include one of S, Se, and Te. The first and second channels may include one of $MoS_2$, $MoSe_2$, $WS_2$, $WSe_2$, and $MoTe_2$.

The field effect transistor may further include a gate insulating layer on the substrate, wherein the first channel may be on the gate insulating layer and the second channel may be on the first channel. The field effect transistor may further include a passivation layer on the substrate and covering the second channel. The field effect transistor may further include a second gate electrode on the passivation layer corresponding to the second channel.

The field effect transistor may further include an insulating interlayer between the first channel and the second channel. The insulating interlayer may include one of hafnium oxide, alumina and silicon nitride. The insulating interlayer may have a thickness of about 1 nm to about 100 nm.

The field effect transistor may further include a second gate electrode on the second channel, wherein the second channel may be on the first channel.

According to example embodiments, a semiconductor device may include the FET.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
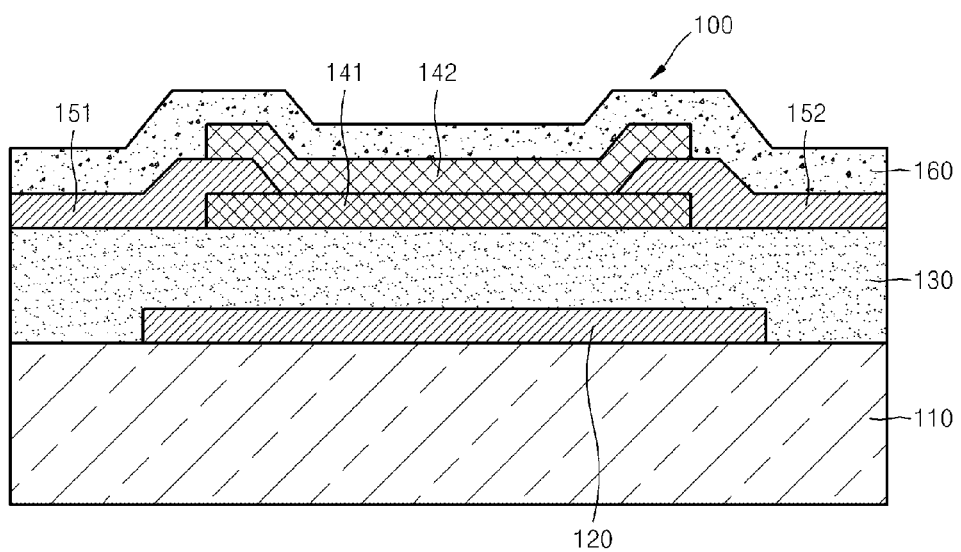
FIG. 1 is a cross-sectional view illustrating a field effect transistor (FET) having double transition metal dichalcogenide channels, according to example embodiments.

Hereinafter, example embodiments will be described in more detail with reference to the accompanying drawings. In the figures, the dimensions of layers and regions are exaggerated for clarity of illustration. Additionally, example embodiments may be embodied in many different forms and thus various modifications thereof are possible. In this specification, when a portion of a layer, a film, a region, and a plate is referred to as being on another portion, it can be directly on the other portion, or intervening portions may also be present. Like reference numerals refer to like elements throughout the specification, and their detailed description will not be repeated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined FIG. 1 is a cross-sectional view illustrating a field effect transistor (FET) 100 having double transition metal dichalcogenide channels, according to example embodiments.

Referring to FIG. 1, the FET 100 having double transition metal dichalcogenide channels may include a gate electrode 120 on a substrate 110. A gate insulating layer 130 may be formed on the substrate 110 to cover the gate electrode 120. A first channel 141 formed of transition metal dichalcogenide may be formed on the gate insulating layer 130 above the gate electrode 120. A source electrode 151 and a drain electrode 152 may be formed on the gate insulating layer 130 to cover both ends of the first channel 141.

A second channel 142 formed of transition metal dichalcogenide may be further formed on the first channel 141. Both ends of the second channel 142 may cover end portions of the source electrode 151 and the drain electrode 152, respectively. A passivation layer 160 may be formed on the substrate 110 to cover the second channel 142.

The end portions of the source electrode 151 and the drain electrode 152 may be respectively interposed between the first channel 141 and the second channel 142, and thus contact the first channel 141 and the second channel 142.

A substrate, which is used for manufacturing a general semiconductor device, may be used for the substrate 110. For example, the substrate 110 may be one of a glass substrate, a plastic substrate, and a silicon substrate. When the substrate 110 is a conductive substrate, e.g., a silicon substrate, in order for insulation with the gate electrode 120, an oxide layer (e.g., a $SiO_2$ layer) obtained by thermally oxidizing a silicon substrate may be further formed on a surface of the substrate 110.

The gate electrode 120 may control electrical characteristics of the first channel 141 and the second channel 142 and may be formed of conductive materials, for example, existing electrode metals or conductive oxides. For example, the gate electrode 120 may be formed of metals (e.g., Ti, Pt, Ru, Au, Ag, Mo, Al, W, and Cu) or conductive oxides (e.g., InZnO (IZO) and AlZnO (AZO)).

The gate insulating layer 130 may be formed using insulating materials used for existing semiconductor devices. For example, the gate insulating layer 130 may be formed of $SiO_2$ or a high-k material having a higher dielectric constant than $SiO_2$ (e.g., $HfO_2$ and $Al_2O_3$).

The first channel 141 may be formed of a transition metal dichalcogenide. The first dielectric layer 141 may be formed with a single layer structure or a multi-layer structure. The first channel 141 including a plurality of layers has a relatively strong interatomic covalent bond at an in-plane and has a layered structure bonded by weak Van der Waals forces between layers. Because the moving path of carriers is increased in the first channel 141 including a plurality of layers, carrier mobility is improved. The first channel 141 may have a two-dimensional plate structure where two chalcogens are combined with one of Mo, W, and Nb. The chalcogen may include S, Se, and Te. The first channel 141 may include one of $MoS_2$, $MoSe_2$, $WS_2$, $WSe_2$, and $MoTe_2$. The second channel 142 may be formed of the same material as the first channel 141.

The source electrode 151 and the drain electrode 152 may be formed using a metal (e.g., Pt, Ru, Au, Ag, Mo, Al, W or Cu) or a conductive oxide (e.g., IZO or AZO). Each of the source electrode 151 and the drain electrode 152 may include a single layer or a multi-layer. Each of one end of the source electrode 151 and one end of the drain electrode 152 may be interposed between the first channel 141 and the second channel 142, so as to contact both the first channel 141 and the second channel 142. A current from the source electrode 151 flows into the drain electrode 152 through the first channel 141 and the second channel 142. Accordingly, a current injection length from the source electrode 151 may be shortened, and also a current moving length from the first channel 141 and the second channel 142 to the drain electrode 152 may be shortened.

Each of the first channel 141 and the second channel 142 may be formed of a plurality of transition metal dichalcogenide layers.

When a source electrode and a drain electrode are formed on a channel having a multi-layer structure, contact resistance is increased as current flows into a channel far from the source electrode and the drain electrode. Compared to this, according to example embodiments, contact resistance is further reduced because current directly flows from the source electrode 151 and the drain electrode 152 to the first channel 141 and the second channel 142.

The passivation layer 160 may be formed of $SiO_2$ or a high-k material, e.g., $HfO_2$, $Al_2O_3$, and $Si_3N_4$.

Although the gate electrode 120 shown in FIG. 1 is a bottom gate electrode, the present disclosure is not limited thereto. For example, instead of the gate electrode 120, a top gate electrode may be formed on the passivation layer 160, but a detailed description thereof will be omitted here.

According to example embodiments, because a current moving path is increased due to a plurality of channels and a contact resistance between the plurality of channels and a source electrode (or a drain electrode) is reduced, carrier mobility is improved.

Figure 2:
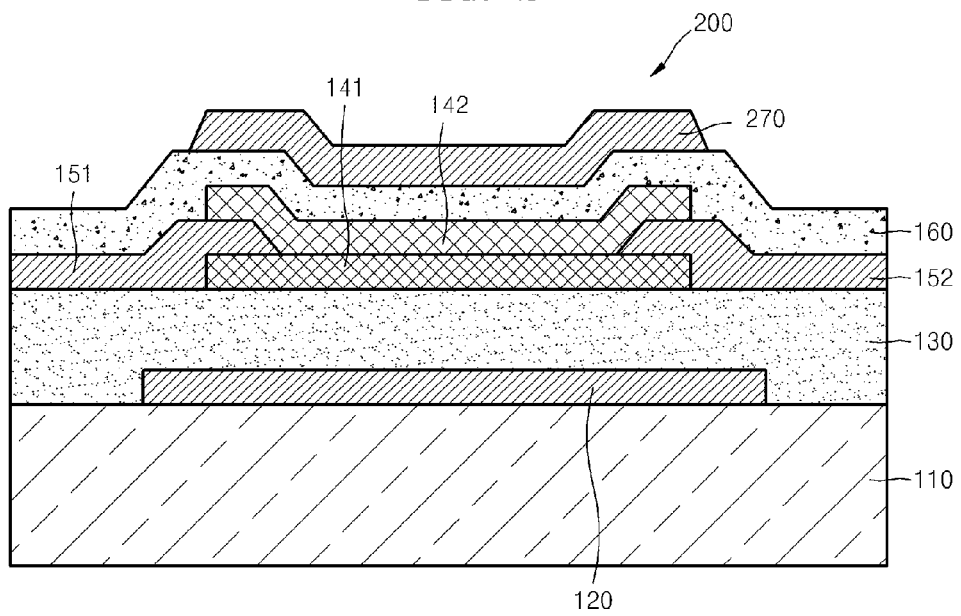
FIG. 2 is a cross-sectional view illustrating a structure of a FET having double transition metal dichalcogenide channels, according to example embodiments.

FIG. 2 is a cross-sectional view illustrating a structure of a FET 200 having double transition metal dichalcogenide channels, according to example embodiments.

Referring to FIG. 2, the FET 200 having double transition metal dichalcogenide channels further includes a second gate electrode 270 on the passivation layer 160 in comparison to the FET 100 having double transition metal dichalcogenide channels. The second gate electrode 270 may be formed of the same material as the gate electrode 120. By using the gate electrode 120 and the second gate electrode 270 together, current flow control of the second channel 142 may be easier, and accordingly, more current flows between the source electrode 151 and the drain electrode 152

In relation to the FET 200 according to example embodiments, because more current flows, carrier mobility is improved.

Figure 3:
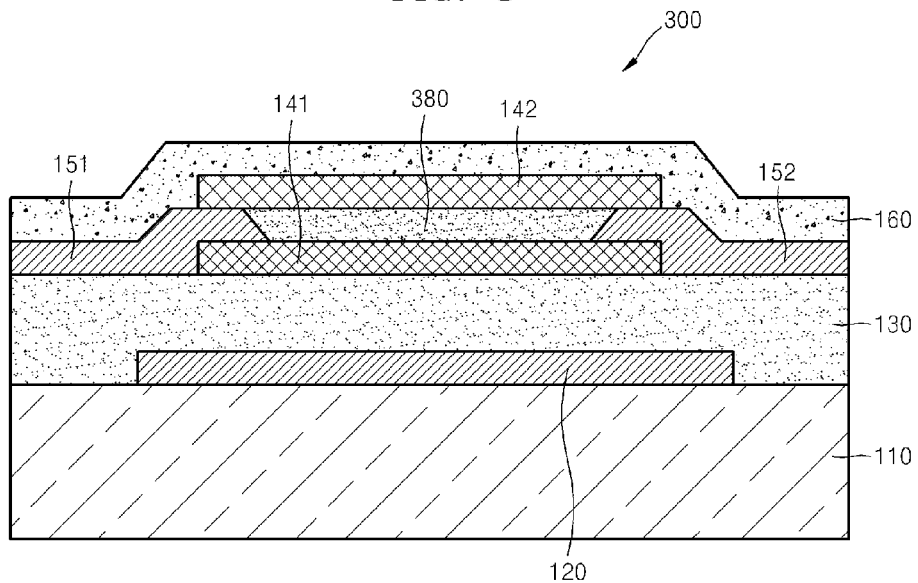
FIG. 3 is a cross-sectional view illustrating a structure of a FET having double transition metal dichalcogenide channels, according to example embodiments.

FIG. 3 is a cross-sectional view illustrating a structure of a FET 300 having double transition metal dichalcogenide channels, according to example embodiments.

Referring to FIG. 3, the FET 300 having double transition metal dichalcogenide channels further includes an insulating interlayer 380 between the first channel 141 and the second channel 142 in comparison to the FET 100 having double transition metal dichalcogenide channels. The insulating interlayer 380 may be formed of a high dielectric material, e.g., high-k $HfO_2$, $Al_2O_3$, or $Si_3N_4$. The insulating interlayer 380 may be formed to have a thickness of about 1 nm to about 100 nm. If the insulating interlayer 380 is thinner than about 1 nm, the first channel 141 and the second channel 142 may be electrically connected through the insulating interlayer 380. If the insulating interlayer 380 is thicker than about 100 nm, a voltage of the gate electrode 120 for controlling a current of the second channel 142 may be increased.

In relation to the FET 300 according to example embodiments, the scattering of carriers flowing through the first channel 141 and the second channel 142 may be reduced due to the insulating interlayer 380 formed of a high-k material. Therefore, the carrier mobility of the FET 300 is improved.

The FET 300 according to example embodiments includes a bottom gate electrode, but the present disclosure is not limited thereto. For example, the FET 300 may include a top gate electrode instead of the bottom gate electrode, but a detailed description thereof will be omitted here.

Figure 4:
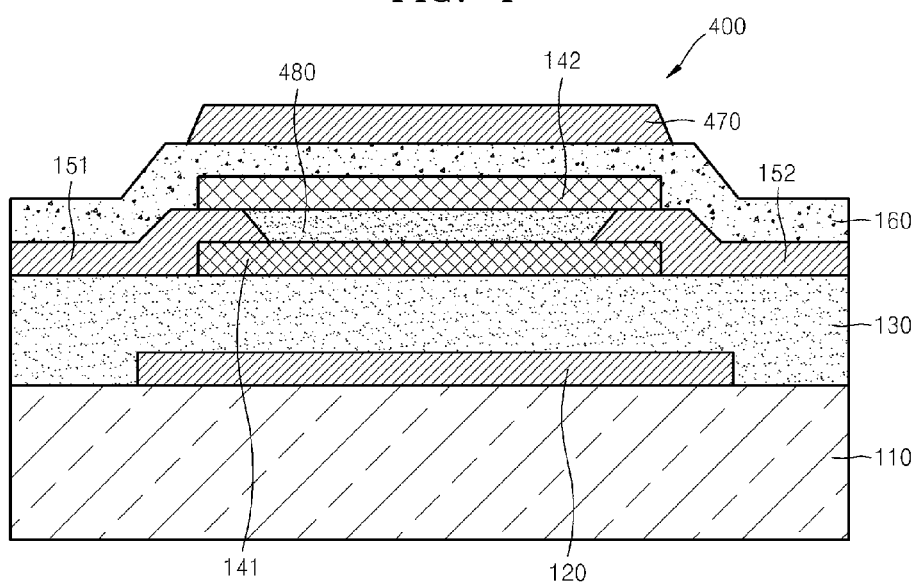
FIG. 4 is a cross-sectional view illustrating a structure of a FET having double transition metal dichalcogenide channels, according to example embodiments.

FIG. 4 is a cross-sectional view illustrating a structure of a FET 400 having double transition metal dichalcogenide channels, according to example embodiments.

Referring to FIG. 4, the FET 400 having double transition metal dichalcogenide channels further includes the insulating interlayer 480 between the first channel 141 and the second channel 142 and the second gate electrode 470 on the passivation layer 160 in comparison to the FET 100 having double transition metal dichalcogenide channels.

The second gate electrode 470 may be formed of the same material as the gate electrode 120.

The insulating interlayer 480 may be formed of a high dielectric material, e.g., high-k $HfO_2$, $Al_2O_3$, or $Si_3N_4$.

By using the gate electrode 120 and the second gate electrode 470 together, current flow control on the second channel 142 may be easier, and accordingly, more current flows between the source electrode 151 and the drain electrode 152

Furthermore, the scattering of carriers flowing through the first channel 141 and the second channel 142 may be reduced due to the insulating interlayer 480 formed of a high-k material. Therefore, the carrier mobility of the FET 400 is improved.

It should be understood that example embodiments described herein should be considered in a descriptive sense only and not for purposes of limitation. Descriptions of features or aspects within each embodiment should typically be considered as available for other similar features or aspects in other embodiments.

What is claimed is:

1. A field effect transistor (FET) comprising:
   first and second channels stacked on a substrate, the first and second channels including a transition metal dichalcogenide;
   a source electrode and a drain electrode contacting both the first channel and the second channel, each of the source electrode and the drain electrode having one end between the first channel and the second channel; and
   a first gate electrode corresponding to at least one of the first channel and the second channel.

2. The FET of claim 1, wherein each of the first channel and the second channel has one of a single layer and a multi-layer structure.

3. The FET of claim 1, wherein each of the first channel and the second channel includes a compound including a transition metal and two chalcogens, the chalcogen including one of S, Se, and Te.

4. The FET of claim 3, wherein each of the first channel and the second channel includes one of $MoS_2$, $MoSe_2$, $WS_2$, $WSe_2$, and $MoTe_2$.

5. The FET of claim 1, further comprising:
   a gate insulating layer on the substrate,
   wherein the first channel is on the gate insulating layer and the second channel is on the first channel.

6. The FET of claim 5, further comprising:
   a passivation layer on the substrate and covering the second channel.

7. The FET of claim 6, further comprising:
   a second gate electrode on the passivation layer corresponding to the second channel.

8. The FET of claim 5, further comprising:
   an insulating interlayer between the first channel and the second channel.

9. The FET of claim 8, wherein the insulating interlayer includes one of hafnium oxide, alumina and silicon nitride.

10. The FET of claim 8, wherein the insulating interlayer has a thickness of about 1 nm to about 100 nm.

11. The FET of claim 1, further comprising:
    a second gate electrode on the second channel,
    wherein the second channel is on the first channel.

12. The FET of claim 11, further comprising:
    an insulating interlayer between the first channel and the second channel.

13. The FET of claim 12, wherein the insulating interlayer includes one of hafnium oxide, alumina and silicon nitride.

14. The FET of claim 12, wherein the insulating interlayer has a thickness of about 1 nm to about 100 nm.

15. A semiconductor device comprising the FET according to claim 1.

* * * * *